(12) United States Patent
Hardee

(10) Patent No.: US 7,151,711 B2
(45) Date of Patent: Dec. 19, 2006

(54) SELF-ADDRESSED SUBARRAY PRECHARGE

(75) Inventor: Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 8 days.

(21) Appl. No.: 11/064,353

(22) Filed: Feb. 23, 2005

(65) Prior Publication Data

US 2006/0187727 A1 Aug. 24, 2006

(51) Int. Cl.
*G11C 8/00* (2006.01)
(52) U.S. Cl. .................. 365/230.06; 365/203
(58) Field of Classification Search ........... 365/230.06, 365/203, 230.08, 189.05
See application file for complete search history.

(56) References Cited

U.S. PATENT DOCUMENTS

| | | | | |
|---|---|---|---|---|
| 5,282,167 A | * | 1/1994 | Tanaka et al. | 365/206 |
| 5,856,952 A | * | 1/1999 | Yoo et al. | 365/230.08 |
| 6,160,752 A | * | 12/2000 | Kohno | 365/230.06 |

* cited by examiner

*Primary Examiner*—Vu A. Le
(74) *Attorney, Agent, or Firm*—Peter J. Meza; William J. Kubida; Hogan & Hartson LLP

(57) ABSTRACT

Power consumption in an integrated circuit memory is reduced by lowering the power supply demand from an on-chip pumped VCCP power source. Only the row decoders for subarrays in a memory bank that were previously activated are precharged in response to a bank precharge command. Additional circuitry is provided to the precharge clock generator circuit. The additional circuitry includes a latch that is set when an array select signal is asserted, and reset when a precharge operation for that bank occurs.

18 Claims, 4 Drawing Sheets

SELF-ADDRESSED SUBARRAY PRECHARGE

BACKGROUND OF THE INVENTION

The present invention relates, in general, to the field of integrated circuit memories ("DRAMs"). More particularly, the present invention relates to a method of refreshing the row decoders in an integrated circuit that conserves power from an on-chip pumped high voltage source.

A highly simplified block diagram of a typical DRAM 10 is shown in FIG. 1. A single memory bank 14 includes a plurality of individual memory subarrays 16. Row decoders 12 and other row path circuits such as precharging circuits are coupled to the word lines of the memory cells found in subarrays 16. Column decoder 18 is coupled to the bit lines of the memory cells found in subarrays 16. Row decoder block 12 receives, among many other signals not shown, a PRE precharge command signal, a clock signal, and an array select signal.

In a typical DRAM 10 a high voltage precharge clock is used to precharge the row decoders and other row path circuits. These row path circuits drain current from a high voltage pumped supply ("VCCP"). This current can be significant, and since the high voltage supply is provided by an on-chip voltage pump, the current required from the external low voltage supply is a multiple of the internal high voltage current due to the efficiency of the voltage pump, which is typically in the range of 25% to 33%.

When a precharge command is initiated, the address of the bank to be precharged is used to activate only the internal high voltage precharge clocks that are needed to precharge the row circuitry in all of the sub-arrays in this one bank. Typically, a single memory bank 14 may contain 2–16 or more subarrays. The bank precharge function reduces the current from the high voltage supply compared to precharging all banks simultaneously.

An example of a prior art precharged row decoder 20 is shown in FIG. 2. Notice that all of the gates and transistors in row decoder 20 are directly or indirectly coupled to the pumped VCCP high voltage power supply. An input section includes a P-channel transistor M1 for receiving the precharge clock signal P0B, an N-channel transistor M2 coupled to VCC, an N-channel transistor M3 for receiving an "R543" control signal, and an N-channel transistor M4 for receiving the array select signal ("ASEL"). The input section is coupled to a latch including cross-coupled inverters INV1 and INV2. The latch is in turn coupled to the WL word line output through serially coupled inverter INV3 and a level shifting inverter.

As can be seen in the timing waveforms shown in FIG. 3, signal P0B goes low to precharge (reset) the row decoder 20. Assume, for example, that there are 33 row decoders for each subarray and eight subarrays in each bank. Therefore, where a bank precharge command is given to the DRAM macro, the P0B precharge clock signal for an entire bank (8×33=264 row decoders) must switch to a low state and then back to a high state (VCCP power supply level). Since the P0B signal is connected to 264 PMOS transistors (transistor M1 in row decoder 20), there is a large capacitance on the P0B signal line, which results in a large amount of current flowing from the VCCP high voltage supply when P0B transitions to a high state.

A prior art P0B precharge clock generator 40 is shown in FIG. 4. An input NAND gate receives the PRE precharge control signal. A transmission gate circuit including P-channel transistor M3 and N-channel transistor M4 is coupled to the output of the input NAND gate. An N-channel transistor M5 is coupled between the inverting switching input of the transmission gate and the output of the transmission gate. An inverter INV6 is coupled between the non-inverting and inverting switching inputs of the transmission gate. A delay circuit including serially-coupled inverters is coupled between the CLK input and the second input to the NAND gate. An output level shifter receives power from the VCCP power supply and provides the output P0B precharge clock signal.

With reference to the timing diagram of FIG. 5, if the precharge signal PRE is high when the clock signal CLK goes high, then the output precharge clock signal P0B goes low. The PRE precharge signal is an internal bank precharge command signal. There is one PRE signal for each bank. Therefore, for example, if there are four total memory banks for a particular design, then four PRE signals are required. After CLK goes high, node N4 goes high after a delay through serially coupled inverters INV7, INV8, INV9, and NAND1. This causes node N6 to go low and output P0B to go high. As stated earlier, the P0B precharge clock signal is connected to all of the row decoders in a bank in prior art memory architecture 10.

What is desired, therefore, is a circuit and method of operation that retains the benefits of the previously described circuit, but would precharge only the row circuits in the subarrays that have been previously activated instead of all the subarrays within a bank. This reduces the current from the internal high supply by the ratio of the number of subarrays in one bank. In order to limit integrated circuit size and cost, the reduction in precharge current is ideally accomplished without using extra address inputs to determine which subarrays to precharge.

SUMMARY OF THE INVENTION

According to an embodiment of the present invention, power consumption in an integrated circuit memory is reduced from an on-chip pumped VCCP power source if only the row decoders in subarrays that were previously activated are precharged in response to a bank precharge command. Additional circuitry is provided to the precharge clock generator circuit. This additional circuitry includes, in part, a latch that is set when an array select signal is high, and reset when a precharge operation for that bank occurs.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 6:
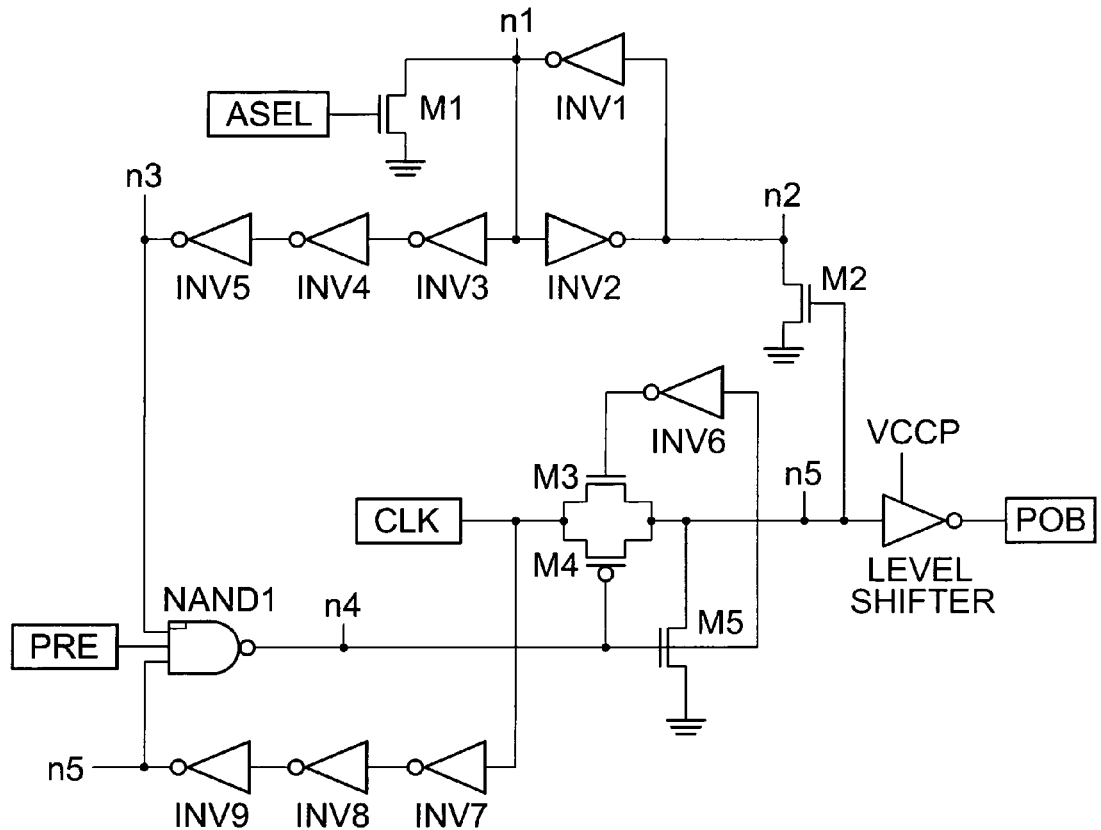
FIG. 6 is a schematic diagram of a precharge clock generator circuit according to an embodiment of the present invention.

Referring now to FIG. 6, a schematic diagram is shown of a precharge clock generator 60 for precharging only the row decoder circuits in a subarray that have been previously activated according to an embodiment of the present invention. In part, precharge clock generator 60 includes a latch INV1, INV2 that is set when an array select ASEL signal received by a memory bank is asserted, and reset when a precharge operation for the memory bank occurs. The array select signal ASEL is unique to each subarray, and the PRE precharge signal is unique to the entire memory bank.

Precharge clock generator 60 includes a logic gate NAND1 for receiving a PRE precharge command, and a transmission gate circuit M3, M4, M5, INV6 coupled to the NAND1 logic gate, the transmission gate circuit having an input for receiving a CLK clock signal. A latch circuit INV1, INV2, M1 is coupled to the NAND1 logic gate. The latch circuit has an input for receiving the ASEL array select signal. A level shifting circuit including the LEVEL SHIFTER inverter and transistor M2 is coupled to the transmission gate circuit and the latch circuit for providing the P0B precharge clock signal.

Logic gate NAND1 is a three-input NAND gate, in which a first input is coupled to node N3, a second input receives the PRE precharge signal, and the third input is coupled to node N5. The output of logic gate NAND1 is coupled to node N4.

The transmission gate circuit includes a transmission gate M3, M4 having an input for receiving the CLK clock signal, an output coupled to the level shifting circuit at node N5, a non-inverting switching input at the gate of N-channel transistor M3, and an inverting switching input at the gate of P-channel transistor M4. An inverter INV6 is coupled between the non-inverting and inverting switching inputs. An N-channel transistor M5 has a gate coupled to the inverting switching input, a source coupled to ground, and a drain coupled to the output of the transmission gate at node N5.

Still referring to FIG. 6, precharge clock generator 60 further includes a latch circuit having an N-channel transistor M1 having a gate for receiving the ASEL array select signal, a source coupled to ground, and a drain. The latch including cross-coupled inverters INV1 and INV2 is coupled to between the drain of the N-channel transistor M1 and the drain of transistor M2 at node N2.

A level shifting circuit includes an N-channel transistor M2 having a gate, a source coupled to ground, and a drain coupled to the latch circuit at node N2. The LEVEL SHIFTER inverter has an input coupled to the gate of N-channel transistor M2, a power node for receiving a pumped high voltage VCCP, and an output for providing the P0B precharge clock signal.

The precharge clock generator 60 further includes a delay circuit interposed between the logic gate at node N3 and the latch circuit at node N1. The delay circuit includes three serially-coupled inverters INV3, INV4, and INV5.

The precharge clock generator 60 further includes a delay circuit interposed between the logic gate at node N5 and the transmission gate circuit at the CLK input. The delay circuit includes three serially-coupled inverters INV7, INV8, and INV9.

In operation, a method for operating a memory having at least one memory bank including a plurality of subarrays and a plurality of row decoder circuits associated with the subarrays in the at least one memory bank has been shown. The method, in part, includes precharging only the row decoder circuits in a subarray that have been previously activated.

Figure 1:
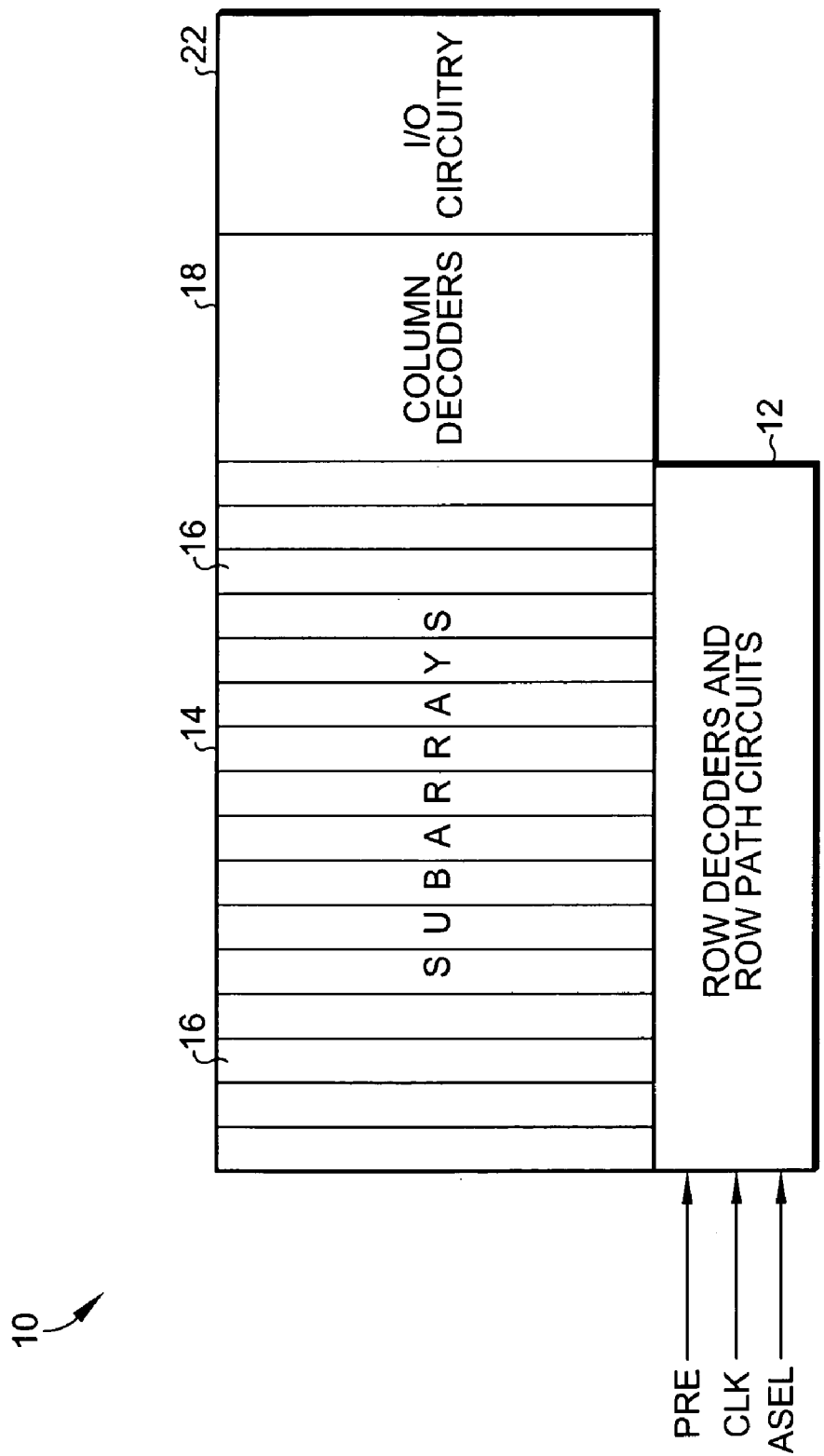
FIG. 1 is a simplified block diagram of a prior art DRAM memory architecture including a single memory bank with associated memory subarrays, as well as row decoders, column decoders, and I/O circuits.
Figure 2:
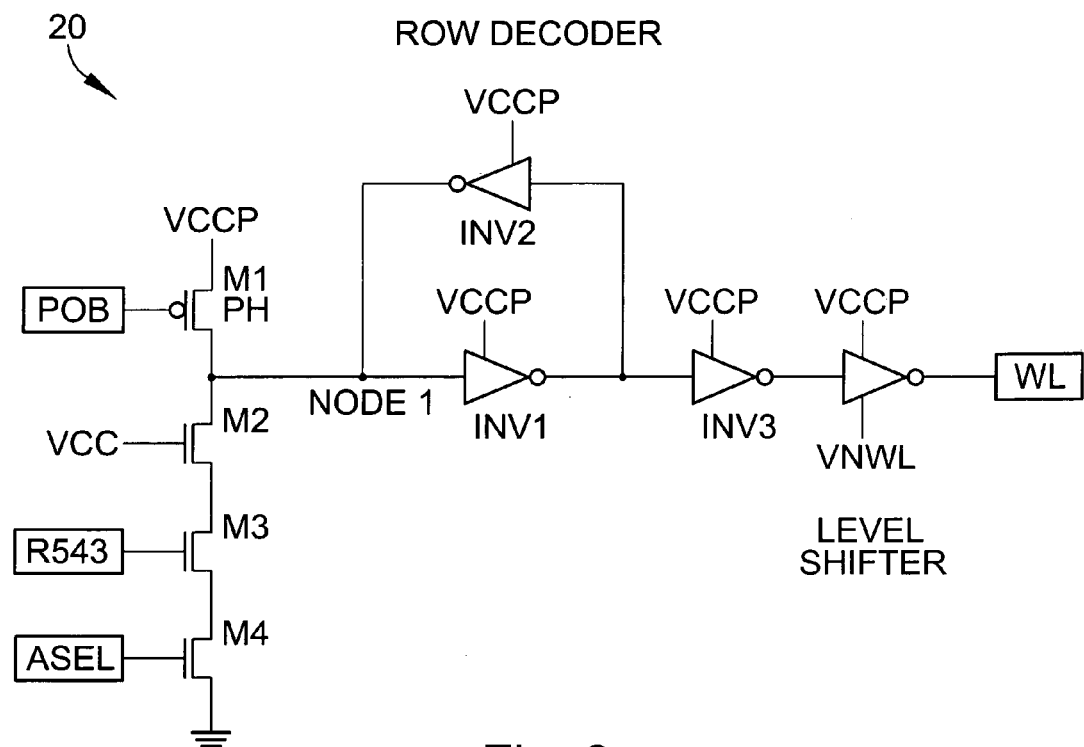
FIG. 2 is a schematic diagram of a prior art row decoder receiving power from an on-chip pumped VCCP power supply.
Figure 3:
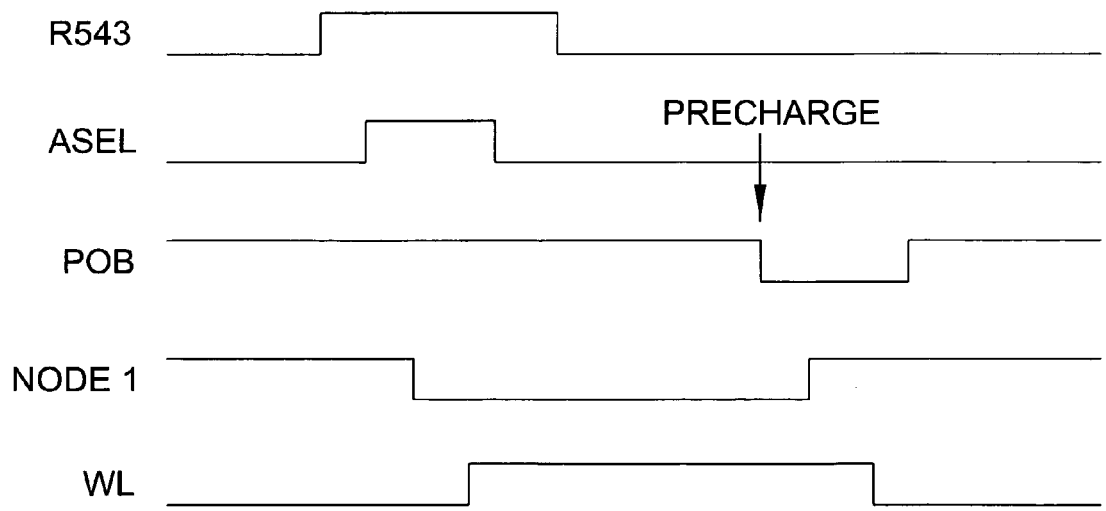
FIG. 3 is a timing diagram for signals associated with the row decoder of FIG. 2.
Figure 4:
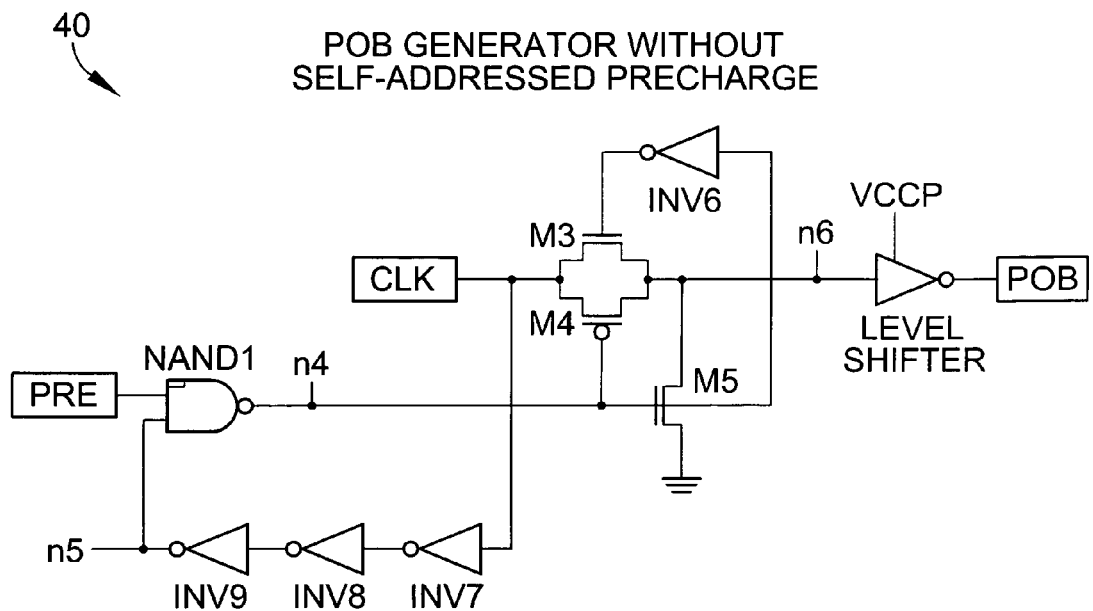
FIG. 4 is a schematic diagram of a prior art precharge clock generator circuit.
Figure 5:
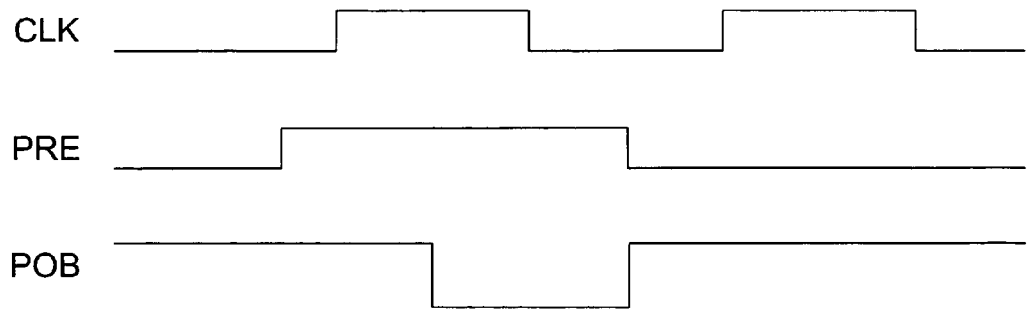
FIG. 5 is a timing diagram for signals associated with the precharge clock generator of FIG. 4.
Figure 7:
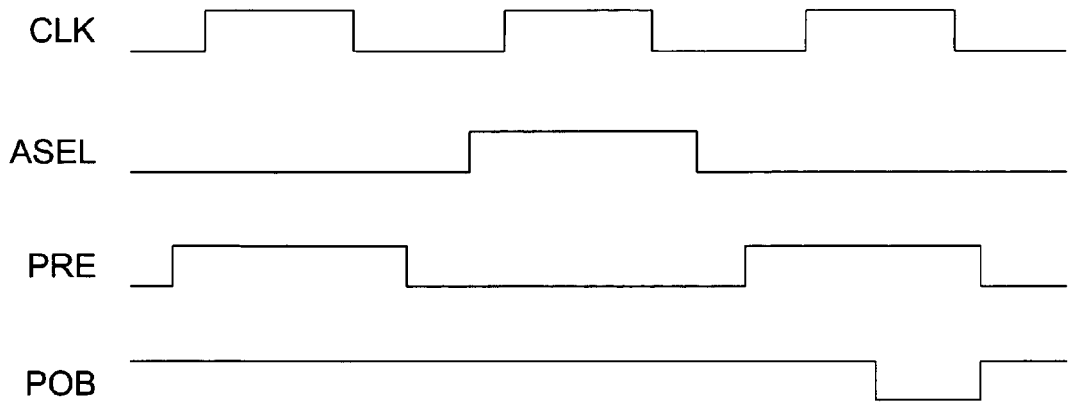
FIG. 7 is a timing diagram for signals associated with the precharge clock generator circuit of FIG. 6.

Referring now to the timing diagram of FIG. 7, the CLK, ASEL, PRE, and P0B signals associated with the precharge clock generator 60 of FIG. 6 are shown. If an ASEL array select command to a particular subarray has occurred, then node N3 is set high, and precharge clock generator 60 operates substantially the same as precharge clock generator 40 shown in FIG. 4. However, if an ASEL array select command to a particular subarray has not occurred since the last bank precharge command, the output signal P0B will not pulse low, even if PRE is high when CLK goes high (i.e., no precharge).

As previously discussed, the array select signal (ASEL) is unique to each subarray, and the PRE signal is unique to each bank (consisting of multiple subarrays). When a bank precharge command PRE is given to the DRAM macro the P0B signal for a given subarray only goes low if that subarray was previously activated by the ASEL signal going high.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory comprising:
    at least one memory bank including a plurality of subarrays;
    a plurality of row decoder circuits associated with the subarrays in the at least one memory bank; and
    means for precharging only the row decoder circuits in a subarray that have been previously activated comprising a latch that is set when an array select signal received by the at least one memory bank is asserted, and reset when a precharge operation for the at least one memory bank occurs.

2. The memory of claim 1 wherein the array select signal is unique to each subarray.

3. The memory of claim 1 wherein the precharge operation is unique to the at least one memory bank.

4. A memory comprising:
   at least one memory bank including a plurality of subarrays;
   a plurality of row decoder circuits associated with the subarrays in the at least one memory bank; and
   a precharge clock generator circuit for precharging only the row decoder circuits in a subarray that have been previously activated,
   wherein the precharge clock generator further comprises inputs for receiving a precharge signal, an array select signal, and a clock signal, and an output for providing a precharge clock signal.

5. The memory of claim 4 wherein the precharge clock generator circuit comprises a power node for receiving a pumped high voltage.

6. A memory comprising:
   at least one memory bank including a plurality of subarrays;
   a plurality of row decoder circuits associated with the subarrays in the at least one memory bank; and
   means for precharging only the row decoder circuits in a subarray that have been previously activated comprising:
   a logic gate for receiving a precharge command;
   a transmission gate circuit coupled to the logic gate, having an input for receiving a clock signal;
   a latch circuit coupled to the logic gate, having an input for receiving an array select signal; and
   a level shifting circuit coupled to the transmission gate circuit and the latch circuit for providing a precharge clock signal.

7. The memory of claim 6 wherein the logic gate comprises a three-input NAND gate.

8. The memory of claim 6 wherein the transmission gate circuit comprises:
   a transmission gate having an input for receiving the clock signal, an output coupled to the level shifting circuit, a non-inverting switching input, and an inverting switching input;
   an inverter coupled between the non-inverting and inverting switching inputs; and
   an N-channel transistor having a gate coupled to the inverting switching input, a source coupled to ground, and a drain coupled to the output of the transmission gate.

9. The memory of claim 8 wherein the transmission gate comprises parallel-coupled N-channel and P-channel transistors.

10. The memory of claim 6 wherein the latch circuit comprises:
    an N-channel transistor having a gate for receiving the array select signal, a source coupled to ground, and a drain; and
    a latch coupled to the drain of the N-channel transistor.

11. The memory of claim 10 wherein the latch comprises two cross-coupled inverters.

12. The memory of claim 6 wherein the level shifting circuit comprises:
    an N-channel transistor having a gate, a source coupled to ground, and a drain coupled to the latch circuit; and
    an inverter having an input coupled to the gate of the N-channel transistor, a power node for receiving a pumped high voltage, and an output for providing the precharge clock signal.

13. The memory of claim 6 further comprising a delay circuit interposed between the logic gate and the latch circuit.

14. The memory of claim 13 wherein the delay circuit comprises three serially-coupled inverters.

15. The memory of claim 6 further comprising a delay circuit interposed between the logic gate and the transmission gate circuit.

16. The memory of claim 15 wherein the delay circuit comprises three serially-coupled inverters.

17. A memory comprising:
    at least one memory bank including a plurality of subarrays;
    a plurality of row decoder circuits associated with the subarrays in the at least one memory bank; and
    a precharge clock generator circuit for precharging only the row decoder circuits in a subarray that have been previously activated,
    wherein the precharge clock generator circuit comprises a latch that is set when an array select signal received by the at least one memory bank is asserted, and reset when a precharge operation for the at least one memory bank occurs.

18. The memory of claim 17 wherein the precharge clock generator circuit comprises a power node for receiving a pumped high voltage.

* * * * *